(12) United States Patent
Himpe

(10) Patent No.: US 7,714,746 B2
(45) Date of Patent: May 11, 2010

(54) METHOD AND APPARATUS FOR KEYBOARD READOUT

(75) Inventor: Vincent Himpe, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 848 days.

(21) Appl. No.: 11/559,588

(22) Filed: Nov. 14, 2006

(65) Prior Publication Data

US 2008/0111712 A1 May 15, 2008

(51) Int. Cl.
*H03K 17/94* (2006.01)
*H03M 11/00* (2006.01)

(52) U.S. Cl. .............................. 341/26; 341/22; 341/24; 345/168

(58) Field of Classification Search .................... 341/22, 341/24, 26; 345/168
See application file for complete search history.

(56) References Cited

U.S. PATENT DOCUMENTS

| | | | | |
|---|---|---|---|---|
| 4,194,188 A | * | 3/1980 | Marino et al. | 341/24 |
| 4,581,603 A | * | 4/1986 | Ingold et al. | 341/24 |
| 5,189,417 A | * | 2/1993 | Caldwell et al. | 341/26 |
| 5,805,085 A | * | 9/1998 | Hsu et al. | 341/26 |

* cited by examiner

*Primary Examiner*—Timothy Edwards, Jr.
(74) *Attorney, Agent, or Firm*—Lisa K. Jorgenson; Renee Michelle Leveque

(57) ABSTRACT

A key switch matrix circuit includes key switches arranged in rows and columns, each row having a scan line, each column having a sense line. Each key switch is operable to couple a scan line to a sense line. A scan signal delivery circuit supplies scan signals to the scan lines, the scan signals delivering a scan pulse to each row of the key switch matrix circuit in turn. A key switch detection circuit outputs a first signal if a key switch is operated and a scan pulse detection circuit outputs a second signal if a scan pulse is coupled to a sense line. The scan signal delivery circuit begins supplying scan signals in response to the first signal and stops supplying scan signals in response to the second signal. In one embodiment, a processor reads the sense lines in response to the second signal.

26 Claims, 7 Drawing Sheets

METHOD AND APPARATUS FOR KEYBOARD READOUT

BACKGROUND

Keyboards or keypads are used to provide user input to a variety of devices, including portable electronic devices. Handheld electronic devices, such as cellular telephones, personal digital assistants and handheld computers for example, are battery operated. It is highly desirable that these devices have low power consumption so as to maximize battery life.

Keyboard readout is the process of detecting a key switch and generating a signal to a processor to indicate which key has been pressed.

One approach to keyboard readout is to use one wire for each key of the keyboard. Each wire is coupled to an input of a processor and the processor monitors the inputs to detect when a key is pressed. The approach requires a relatively large number of processor input pins (for example an 8×8 keyboard would require 64 pins) which tends to increase the size and cost of the device. Additionally, the processor has the burden of monitoring these input pins. The action of monitoring the inputs produces a load on the battery and shortens battery life.

A further approach to keyboard readout is to monitor the keys in an array or matrix. In this approach, one output line is used for each row of the matrix and one input line is used for each column of the matrix (for example an 8×8 keyboard would require 8 output lines and 8 input lines). A logic signal is sent to each output line in turns and all inputs lines are monitored. FIG. 1 is a diagrammatic representation of keyboard readout apparatus that uses this approach. FIG. 1 shows a keyboard or keypad 100 consisting of 16 key switches 102 arranged in a 4×4 rectangular array or matrix. Scan lines 104, 106, 108 and 110 allow the scan signals shown in plot 112 to be coupled to the rows of the rectangular array. Each columns of the rectangular array has a sense line (114, 116, 118 and 120) that is coupled via a resistor 122 to an electrical source 124.

In operation, when a key switch is activated, the corresponding scan line is electrically coupled to the sense line. For example, when the black key in FIG. 1 is pressed, the SCAN 2 line 108 is coupled to the SENSE 2 line 118. This causes the signal on the SENSE 2 line 118 to follow the signal on the SCAN 2 line 108, as shown in the plot 126. None of the other sense lines is coupled to a scan line, so their signals remain high and do not follow any scan line. The activated key is identified uniquely by monitoring the scan lines and comparing the timing of any signals to the scan signals. This process requires processing power for both the generation of the scan signals and the monitoring of the sense signals.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
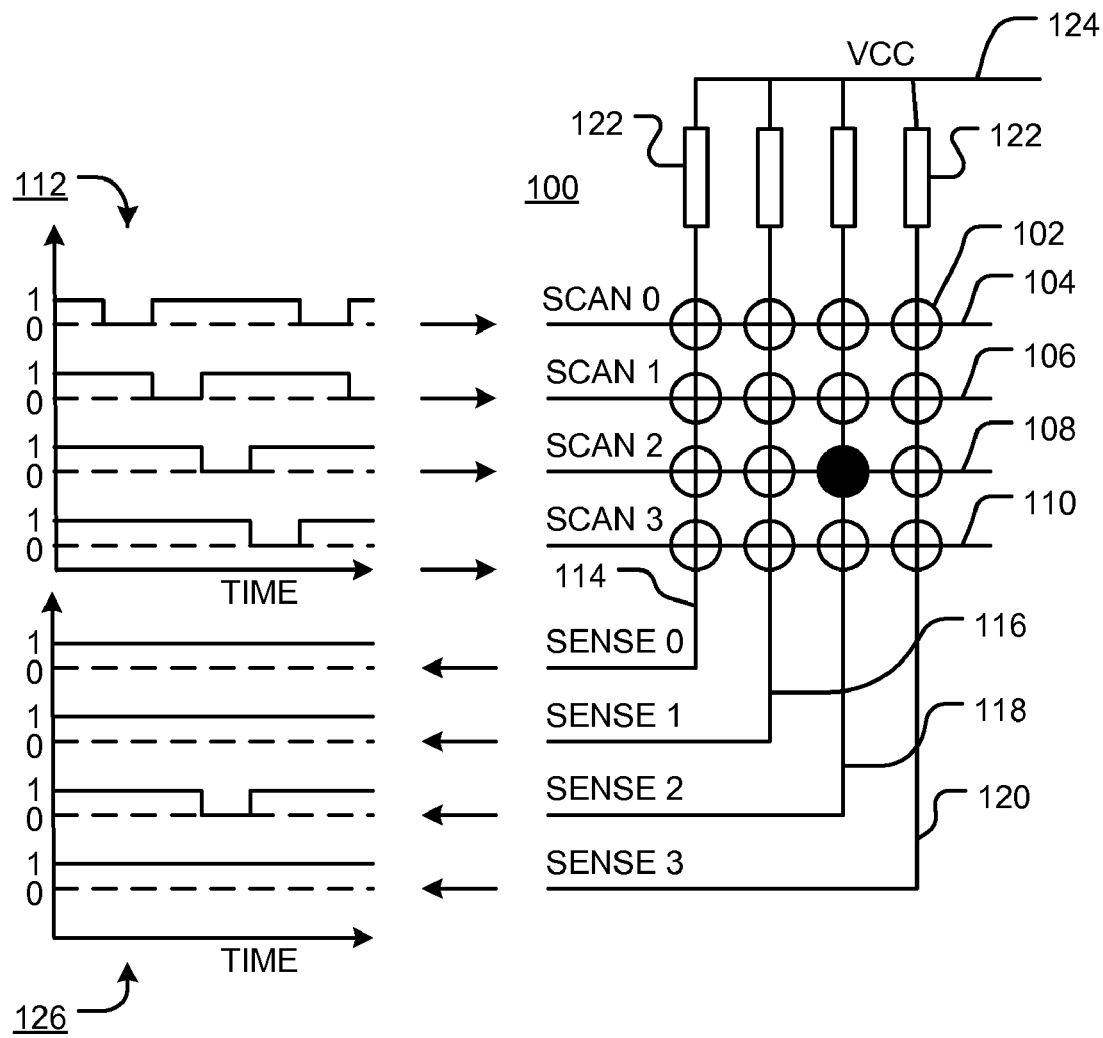
FIG. 1 is a diagrammatic representation of a prior keyboard readout apparatus.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

Figure 2:
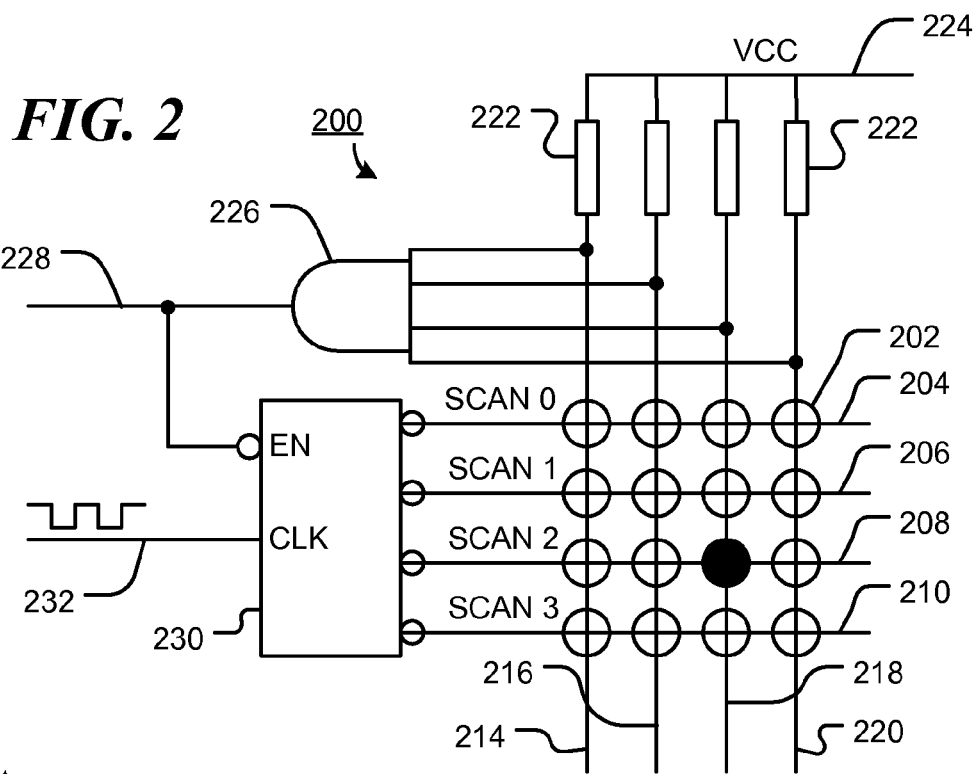
FIG. 2 is a diagrammatic representation of a keyboard readout apparatus consistent with certain embodiments of the present invention.

FIG. 2 is a diagrammatic representation of a keyboard readout apparatus consistent with certain embodiments of the present invention. Referring to FIG. 2, the keyboard readout apparatus 200 includes a keyboard having 16 key switches 202 arranged in a 4×4 rectangular key switch matrix circuit. Any number of key switches may be used, arranged in a rectangular pattern of other pattern. Scan lines 204, 206, 208 and 210 (denoted as SCAN 0, SCAN 1, SCAN 2 and SCAN 3, respectively) are conductors that allow scan signals (shown as 302 in FIG. 3, and discussed below) to be coupled to the rows of the key switch matrix circuit. Each column of the key switch matrix circuit has a sense line (214, 216, 218 and 220) that is coupled via resistance element 222 to an electrical source 224. Other methods of coupling to the electrical source will be apparent to those of ordinary skill in the art. The electrical source 224 may provide any signal. Any signal source can be used. The purpose is to provide a first signal on the sense line if no key is pressed and a second, different, signal on the sense line when the key is pressed. When a key switch is operated (for example by pressing a key on a keyboard) the signal on the corresponding scan line is coupled to the corresponding sense line. The scan lines 214, 216, 218 and 220 are input to a key-switch detection circuit 226. In this embodiment, the key-switch detection circuit 226 is a logical AND gate. The output from the logical AND gate 226 is only asserted when all of the sense lines are asserted. It will be apparent to those of ordinary skill in the art that other forms of key-switch detection may be used.

The output 228 from the key-switch detection circuit 226 is fed to a processor. For example, the output 228 could be coupled to an interrupt pin of the processor and used to wake the processor from a low-power 'sleep' mode when a key is pressed. In an alternative embodiment, the processor monitors the output 228. This requires less processing power than monitoring all of the sense lines. In the sequel, the signal on output 228 will be referred to as an interrupt signal, although it is to be understood that the signal may be polled, used as an interrupt signal or used in some other manner to signal the processor.

The output 228 may also be used to enable a scan signal delivery circuit 230. The scan signal delivery circuit operates as a counter or timer that sequentially toggles the scan signal delivered to each row of the key switch matrix circuit.

Monitoring of the sense lines may be performed by the processor. Monitoring is not required when the key-switch detection signal 228 is not asserted.

In a further embodiment, the scanning signals are generated by the processor. This requires the use of processor output pins, but the scanning need only be performed when a key switch is detected, so power consumption is still lower than with prior approaches.

Operation of the keyboard readout apparatus is further described with reference to plots 302 and 304 in FIG. 3.

In this exemplary embodiment it is assumed that the scanning polarity is a logic low level. It will be apparent to those of ordinary skill in the art that the scanning polarity could alternatively be a logic high level, in which case all of the polarities in the following descriptions would be reversed.

In the sequel a key switch operation may be referred as key press. However, it is to be understood that other types pf switching mechanisms may be used.

In an idle condition all scan lines are at a logic low level. When no key is pressed all of the sense lines are at a logic high level. Thus the output 228 from the logic unit 226 is also at a logic high level.

When a key is pressed, the corresponding sense line is coupled to the corresponding scan line and the sense line falls to a logic low level. This causes the output 228 of the logic gate 226 to become low, which, in turn, enables or releases the scan signal delivery circuit 230. When released, the scan signal delivery circuit generates scan signals to the scan lines 202, 204, 206 and 208. The scanning will continue as long as one or more keys are pressed. When no keys are pressed, the scan signal delivery circuit will complete its sweep and then be disabled. Thus, scanning is only performed when one or more keys are pressed. This mechanism reduces electromagnetic interference (EMI) and power consumption. The scan signal delivery circuit may be synchronized to clock signal 232.

In the embodiment shown in FIG. 2, the key detection and scan pulse detection are both performed by the circuit 226. However, in other embodiments these functions are performed by separate means.

Figure 3:
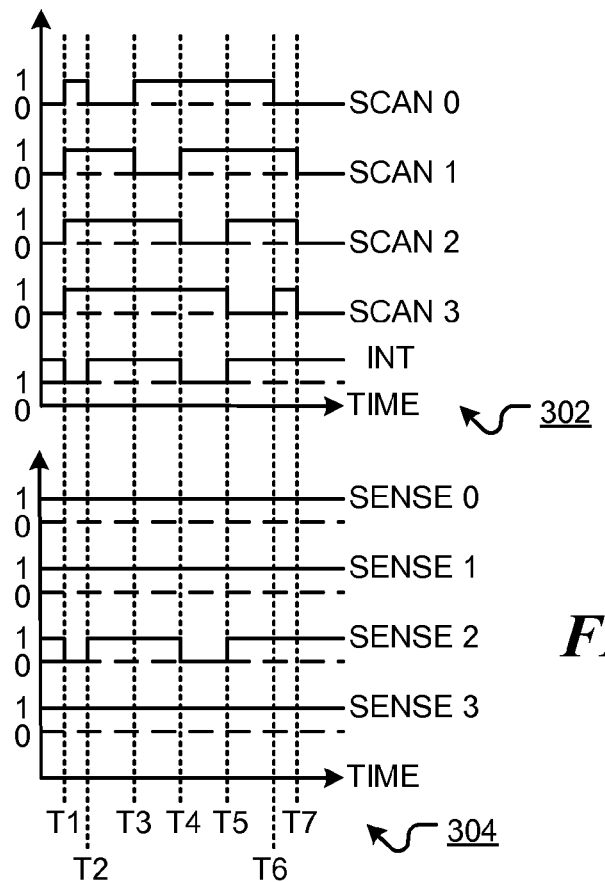
FIG. 3 shows exemplary plots of scan signals and sense signals consistent with certain embodiments of the invention.

FIG. 3 shows exemplary plots of scan signals 302 and sense signals 304 consistent with certain embodiments of the invention. Before transition time T1, all scan signals are at logic low since no key is pressed. The signal labeled 'INT' denotes the interrupt signal that is output on line 228 in FIG. 2 from the key-switch detection circuit 226. At time T1 a key is pressed (the key in third row, third column of the array in this example). This causes the interrupt signal (INT) to go to a logic low, since all of the scan signals, including SCAN 2, are low. This first interrupt signal is used to enable the scan signal delivery circuit (230 in FIG. 2). The first interrupt signal may also be used to indicate to the processor that it should expect a key input. At time T2, the scan signal delivery circuit starts and sets all of the scan signals to logic high. This returns the interrupt signal to logic high. The scan signal delivery circuit then cycles through the scan lines, making each one low in turn. Thus a scan pulse (a logic low pulse in this example) is delivered to each scan line in turn. For example, SCAN 0 is low from time T2 to time T3, SCAN 1 is low from time T3 to time T4, SCAN 2 is low from time T4 to time T5, and SCAN 3 is low from time T5 to time T6. When SCAN 2 goes low at time T4, the line SENSE 2 is pulled low. This causes the interrupt signal to go low again from time T4 to time T5. This causes a second interrupt signal to tell the processor that a key has been found. The processor can then read the levels of the scan lines and sense lines, determine which key has been pressed and perform the appropriate action. The processor may then enter a sleep mode again to conserve battery power. In a further embodiment, the processor may time the period between the first and second interrupt signals. In this embodiment, the processor does not require access to the scan lines, which reduces the number of pins required. The processor and the scan signal delivery circuit may be synchronized by the clock signal 232 in FIG. 2, to ensure accurate timing.

Figure 4:
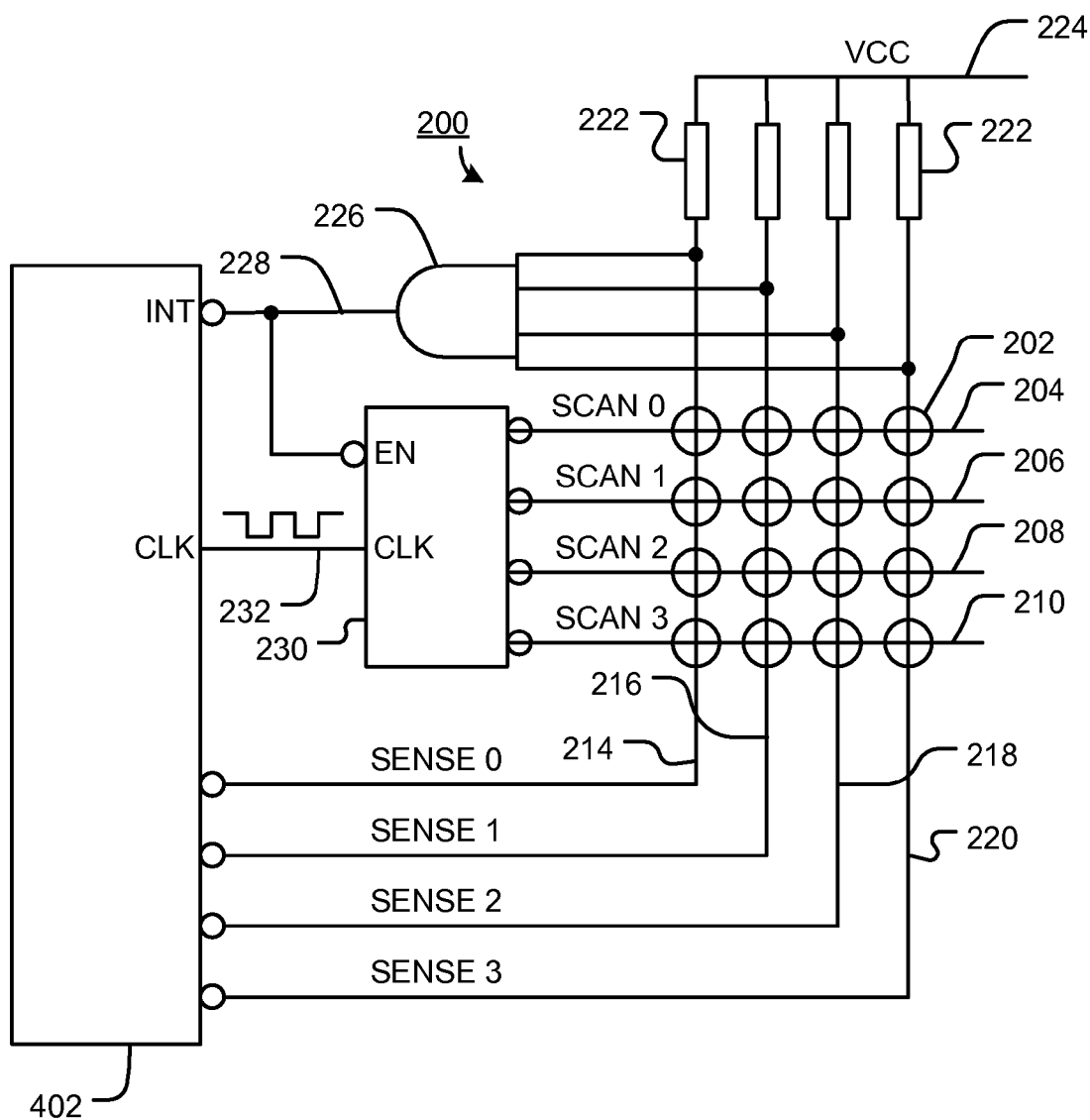
FIGS. 4, 5 and 6 are diagrammatic representations of keyboard readout systems consistent with certain embodiments of the present invention.

FIG. 4 is a diagrammatic representation of a keyboard readout system consistent with certain embodiments of the present invention. Referring to FIG. 4, the keyboard readout apparatus 200 is coupled to a processor 402. In this embodiment, the processor is responsive to the interrupt signal on output 228 and to the sense signals 214, 216, 218 and 220. A clock signal 232 may be used to synchronize the processor 402 and the scan signal delivery circuit 230. The clock signal may be generated by the processor, the scan signal delivery circuit or an external clock source. In operation, the processor receives a first interrupt signal on output 228 when a key is pressed and a second interrupt when the corresponding scan line is pulsed. From the time difference between the interrupt signals, and knowledge of the scan pulse schedule, the processor can determine which row of the keyboard the pressed key is in. When the second interrupt is received, the processor reads the levels of the sense signals to determine which column of the keyboard the pressed key is in. This embodiment minimizes the number of pins used on the processor.

Figure 5:
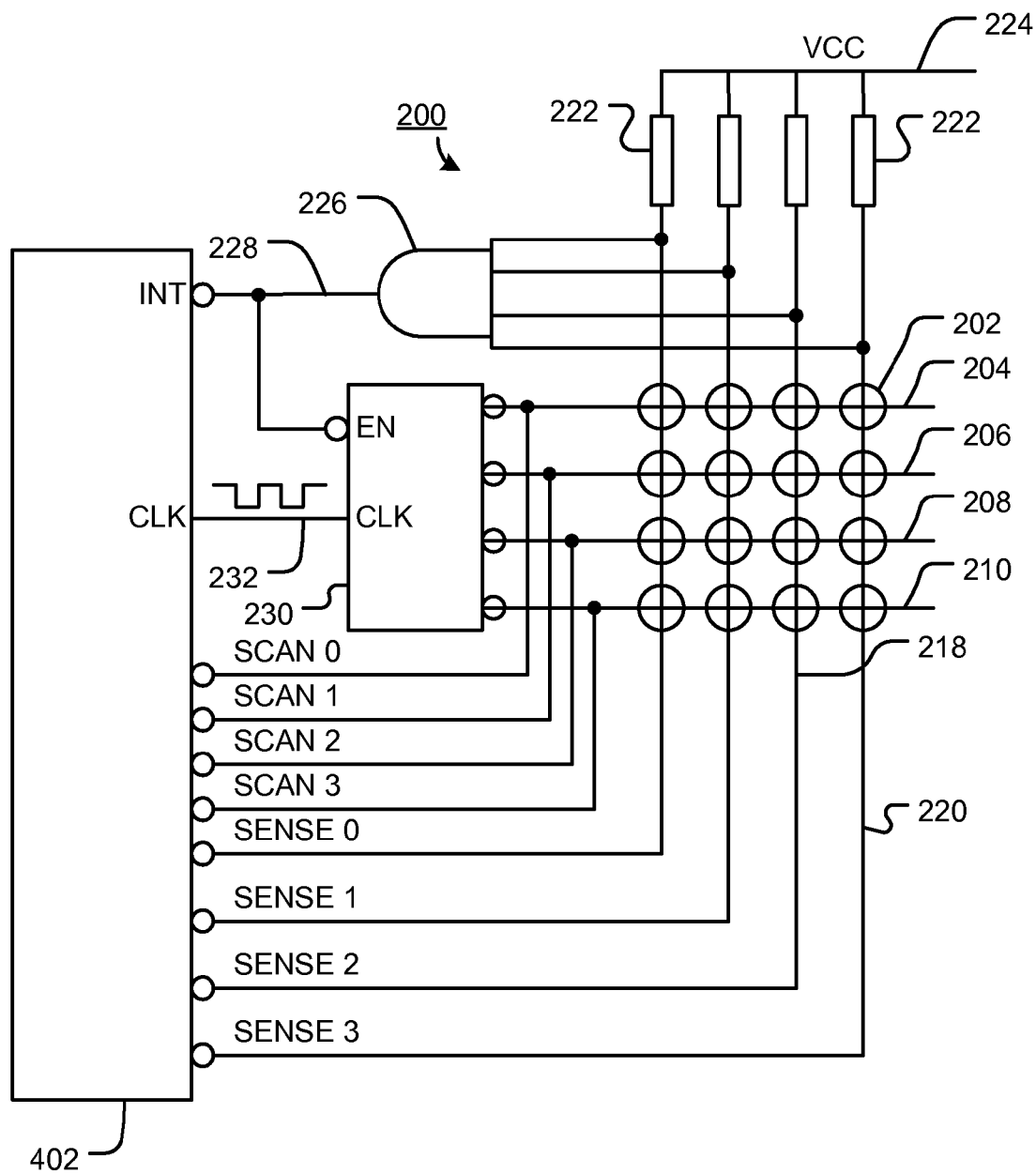
Figure 6:
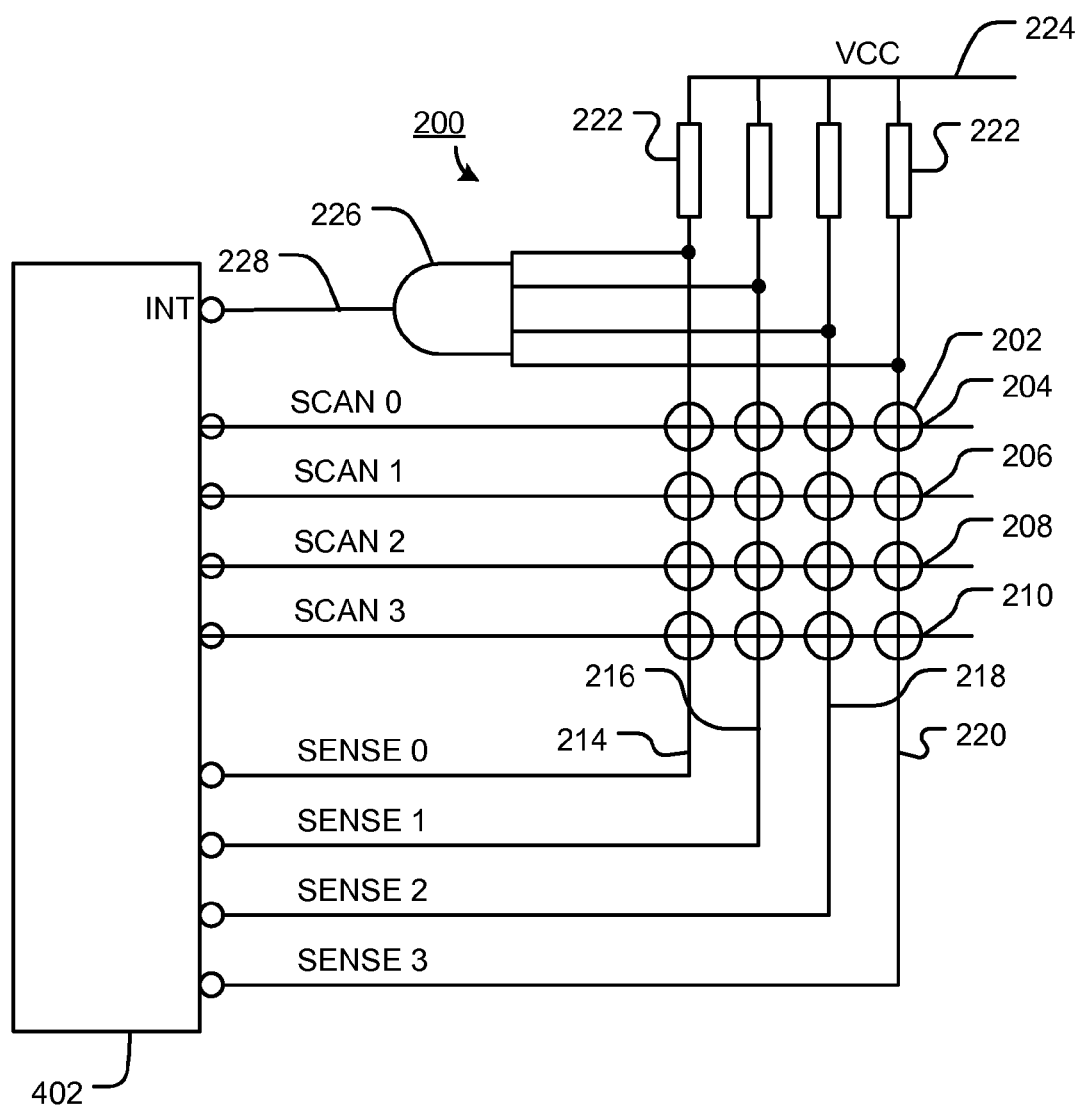

FIG. 5 is a diagrammatic representation of a keyboard readout system consistent with certain further embodiments of the present invention. Referring to FIG. 5, the keyboard readout apparatus 200 is coupled to a processor 402. In this embodiment, the processor is responsive to the interrupt signal 228, the signals on sense lines 214, 216, 218 and 220 and the signals on the scan lines 204, 206, 208 and 210. The processor and the scan signal delivery circuit need not be synchronized. In operation, the processor receives a first interrupt when a key is pressed and a second interrupt when the corresponding scan line is pulsed. When the second interrupt is received, the processor reads the levels of the sense signals and the scan signals to determine which key has been pressed. This embodiment minimizes the processing power of the processor, since the processor is only required to sense the signals when the second interrupt is received FIG. 6 is a diagrammatic representation of a keyboard readout system consistent with certain further embodiments of the present invention. Referring to FIG. 6, the keyboard readout apparatus 200 is coupled to a processor 402. In this embodiment, the processor is responsive to the interrupt signal on output 228 and the signals on sense lines 214, 216, 218 and 220. In addition, the processor generates the signals on the scan lines 204, 206, 208 and 210. In operation, the processor receives a first interrupt when a key is pressed and begins generation of the scan signals. Thus, the scan signal delivery circuit is integral with the processor. A second interrupt is received when the corresponding scan line is pulsed. When the second interrupt is received, the processor reads the levels of the sense signals to determine the row of the pressed key. The column of the pressed key is known since the processor is generating the scan signals. This embodiment avoids the need for a scan signal delivery circuit.

In the embodiments above, the processor need only be active when a key is pressed, thus the battery load is minimized.

Figure 7:
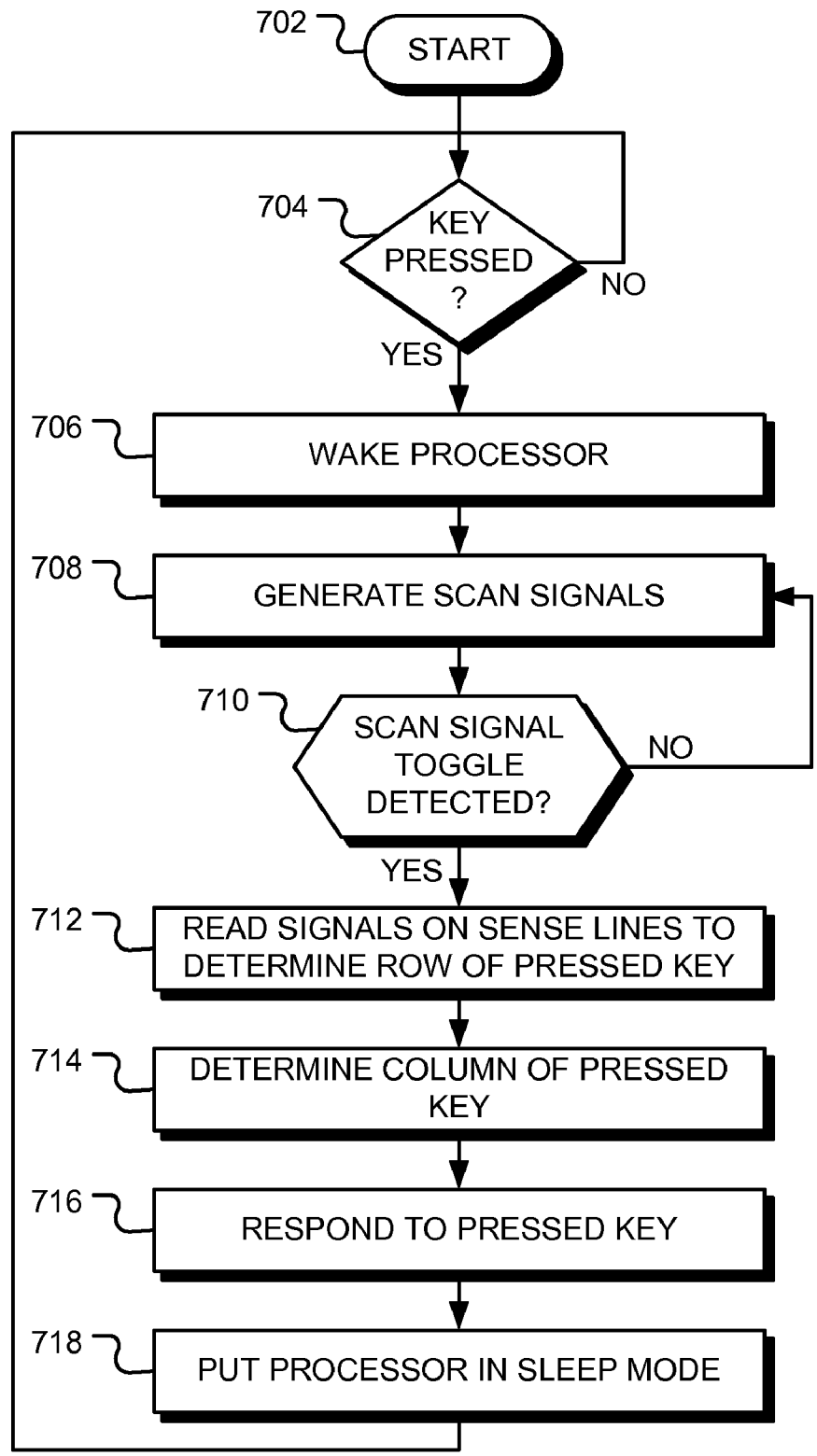
FIG. 7 is a flow chart of a method of keyboard readout consistent with certain embodiments of the present invention.

FIG. 7 is a flow chart of a method of keyboard readout consistent with certain embodiments of the present invention. Following start block 702 in FIG. 7, the keyboard readout system waits in an idle mode at block 704 until a key is pressed. When a key is pressed, an interrupt signal is generated. This signal may be used at block 706 to wake the processor from a low-power sleep mode (or to interrupt other processes). At block 708, generation of the scan signals is started. The scan signals may be generated by the processor or by a scan signal delivery circuit that is enabled by the interrupt signal. Generation of the scan signals continues until, as indicated by the positive branch from decision block 710, a scan pulse is detected on one of the sense lines. This triggers a second interrupt signal. At block 712, the processor reads the signals on the sense lines to determine the column of the pressed key. At block 714, the processor determines the row of the pressed key. If a scan signal delivery circuit external to the processor is used, this can be done by sensing the scan lines or measuring the time period between the first and second interrupt and comparing the time period to a schedule of scan pulses. If the scan signal delivery circuit is integral with the processor, the column is already known to the processor. At block 716, the processor responds to the pressed key and at block 718 the processor returns to the sleep mode (or resumes other activities). Flow then returns to decision block 704 to await the next key switch operation.

The processor may be a programmed processor, a dedicated logic circuit, a field programmable gate array or other device.

Figure 8:
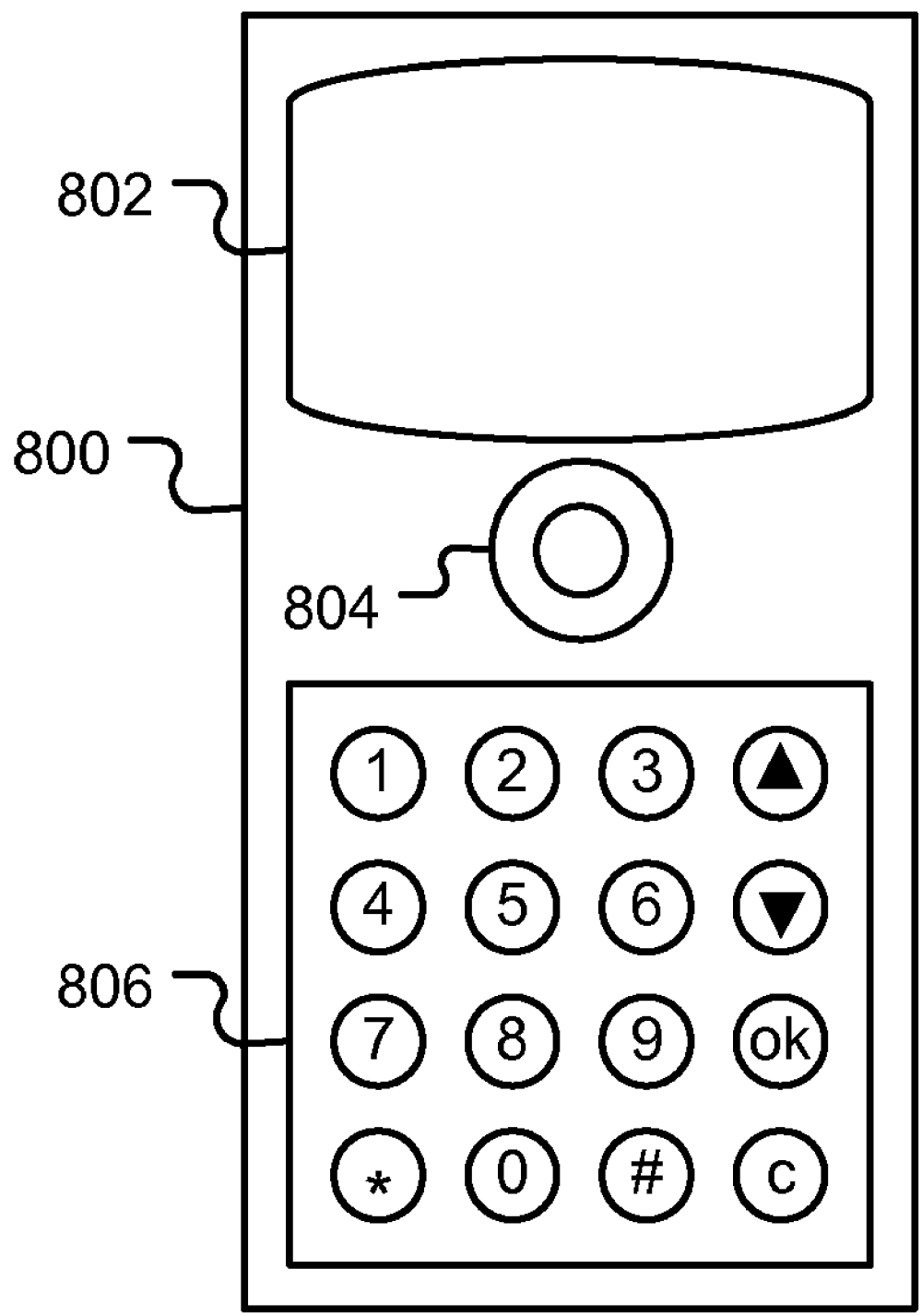
FIG. 8 is a diagrammatic representation of an exemplary portable electronic device consistent with certain embodiments of the invention.

FIG. 8 is a diagrammatic representation of an exemplary portable electronic device consistent with certain embodiments of the invention. The electronic device 800 includes a display screen 802 and a user input device 804. The device may be a handheld electronic device, such as a cellular telephone, personal digital assistant and handheld computer, for example. Such devices are battery-operated and it is highly desirable that these devices have low power consumption so as to maximize battery life. A keyboard 806 enables a user of the portable electronic device to execute key switch operations that are identified by a keyboard readout apparatus as described above. It will be apparent to those of ordinary skill in the art that other means may be used for executing the key switch operations. The use of a low-power keyboard readout apparatus allows the portable electronic device to have reduced power consumption.

Those of ordinary skill in the art will recognize that the present invention has been described in terms of exemplary embodiments. However, the invention should not be so limited, since the present invention could be implemented using hardware component equivalents such as special purpose hardware and/or dedicated processors, which are equivalents to the invention as, described and claimed. Similarly, general purpose computers, microprocessor based computers, digital signal processors, microcontrollers, dedicated processors, custom circuits, ASICS and/or dedicated hard wired logic may be used to construct alternative equivalent embodiments of the present invention.

The present invention, as described in embodiments herein, is implemented using a programmed processor executing programming instructions that are broadly described above in flow chart form that can be stored on any suitable electronic storage medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. An apparatus for identifying a key switch operation comprising:
    a key switch matrix circuit comprising a plurality of key switches arranged in rows and columns, each row having a scan line, each column having a sense line and each key switch operable to couple a scan line to a sense line;
    a scan signal delivery circuit coupled to the scan lines of the switch matrix circuit and operable to supply scan signals to rows of the key switch matrix circuit via the scan lines, the scan signals delivering a scan pulse to each row of the key switch matrix circuit in turn;
    a key switch detection circuit coupled to the sense lines of the switch matrix circuit and to the scan signal delivery circuit, the key switch detection circuit key operable to output a first signal if a key switch of the plurality of key switches is operated; and
    a scan pulse detection circuit, coupled to the sense lines of the switch matrix circuit and to the scan signal delivery circuit, operable to output a second signal if a scan pulse is coupled to a sense line;
    wherein the scan signal delivery circuit is operable to begin supplying scan signals in response to the first signal and to stop supplying scan signals in response to the second signal.

2. An apparatus in accordance with claim 1, further comprising:
    a processor coupled to the sense lines of the switch matrix circuit and the scan pulse detection circuit and operable to read the sense lines in response to the second signal and to determine the column of the operated key switch.

3. An apparatus in accordance with claim 2, wherein the processor is coupled to the scan lines of the key switch matrix circuit as is operable to read the scan lines in response to the second signal to determine the row of the operated key switch.

4. An apparatus in accordance with claim 2, wherein the scan signal delivery circuit is integral to the processor.

5. An apparatus in accordance with claim 2, wherein the processor is coupled to the key switch detection circuit and is further operable to determine the column of the operated key switch from a measure of the time period between the first signal and the second signal.

6. An apparatus in accordance with claim 2, wherein the processor and the scan signal delivery circuit are synchronized by a common clock signal.

7. An apparatus in accordance with claim 2, wherein the scan pulse detection circuit is coupled, at its output, to an interrupt pin of the processor.

8. A battery-powered electronic device including the apparatus of claim 2.

9. An apparatus in accordance with claim 1, wherein the scan signal delivery circuit comprises a counter circuit.

10. An apparatus in accordance with claim 1, wherein the key switch detection circuit is operable to output a logical AND of the signals on the sense lines.

11. A method for identifying a key switch operation in a key switch matrix circuit comprising a plurality of key switches arranged in rows and columns, each row having a scan line, each column having a sense line and each key switch operable to couple a scan line to a sense line, the method comprising:

detecting a key switch operation;

supplying scan signals to the scan lines of the key switch matrix circuit, the scan signals delivering a scan pulse to each row of the key switch matrix circuit in turn if a key switch operation is detected;

detecting a scan pulse on a sense line of the key switch matrix circuit;

identifying the sense line that carries the detected scan pulse; and identifying the scan line that supplied the detected scan pulse; and ceasing supply of the scan signals to the scan lines of the key switch matrix circuit if a scan pulse is detected on a sense line of the key switch matrix circuit.

12. A method in accordance with claim 11, wherein detecting a key switch operation comprises performing a logic operation between signals on the sense lines.

13. A method in accordance with claim 11, wherein detecting a scan pulse on a sense line of the key switch matrix circuit comprises performing a logic operation between signals on the sense lines.

14. A method in accordance with claim 11, wherein identifying the sense line that carries the detected scan pulse comprises:

coupling the sense lines to inputs of a processor;

the processor reading the levels of the sense lines when a scan pulse is detected on a sense line of the key switch matrix circuit.

15. A method in accordance with claim 14, further comprising interrupting the processor when a key switch operation is detected.

16. A method in accordance with claim 15, further comprising:

the processor responding to the identified key switch operation; and the processor entering a low-power mode of operation when the response to the identified key switch operation is completed.

17. A method in accordance with claim 11, wherein identifying the scan line that supplied the detected scan pulse comprises:

coupling the scan lines to inputs of a processor; and the processor reading the levels of the scan lines.

18. A method in accordance with claim 11, wherein identifying the scan line that supplied the detected scan pulse comprises:

measuring a time period between detecting the key switch operation and detecting the scan pulse on a sense line of the key switch matrix circuit; and comparing the time period to a schedule of scan pulses.

19. A method in accordance with claim 11, wherein supplying scan signals to the scan lines of the key switch matrix circuit is performed by a processor coupled to the scan lines of the key switch matrix circuit.

20. A method in accordance with claim 11, wherein supplying scan signals to the scan lines of the key switch matrix circuit is performed by a counter circuit.

21. An apparatus for identifying a key switch operation comprising:

key switch matrix circuit comprising a plurality of key switches arranged in rows and columns, each row having a scan line, each column having a sense line and each key switch operable to couple a scan line to a sense line;

a switch detection means for detecting a key switch operation;

a scan signal means for supplying scan signals to the scan lines of the key switch matrix circuit, the scan signals delivering a scan pulse to each row of the key switch matrix circuit in turn if a key switch operation is detected by the switch detection means;

a scan pulse detection means for detecting a scan pulse on a sense line of the key switch matrix circuit; and a means for identifying the sense line that carries the detected scan pulse;

a means for identifying the scan line that supplied the detected scan pulse;

wherein operation of the scan signal means is halted if a scan pulse is detected by the scan pulse detection means.

22. An apparatus in accordance with claim 21, wherein the means for identifying the sense line that carries the detected scan pulse comprises a processor that receives the sense lines as inputs.

23. An apparatus in accordance with claim 22, wherein the processor is operable to read the sense lines in response to a signal from the scan pulse detection means.

24. An apparatus in accordance with claim 22, wherein the processor is operable to read the scan lines in response to a signal from the scan pulse detection means.

25. An apparatus in accordance with claim 21, wherein the means for identifying the scan line that supplied the detected scan pulse comprises a timing means, responsive to the key switch detection means and the scan pulse detection means, for measuring the time between the key switch operation and detection of the scan pulse.

26. A portable electronic device comprising:

an interface operable to allow a user of the portable electronic device to execute a key switch operation;

a key switch matrix circuit comprising a plurality of key switches arranged in rows and columns, each row having a scan line, each column having a sense line and each key switch operable to couple a scan line to a sense line;

a switch detector operable to detect the key switch operation;

a scan signal element operable to supply scan signals to the scan lines of the key switch matrix circuit, the scan signals delivering a scan pulse to each row of the key switch matrix circuit in turn if a key switch operation is detected by the switch detector;

a scan pulse detector operable to detect a scan pulse on a sense line of the key switch matrix circuit; and a sense line identifier element operable to identify the sense line that carries the detected scan pulse;

a scan line identifier element operable to identify the scan line that supplied the detected scan pulse; and a processor operable to respond to the key switch operation corresponding to identified scan line and the identified sense line, wherein operation of the scan signal means is halted if a scan pulse is detected by the scan pulse detector.

* * * * *